United States Patent [19]
Mun et al.

[11] Patent Number: 5,648,979
[45] Date of Patent: Jul. 15, 1997

[54] ASSEMBLY OF VCSEL LIGHT SOURCE AND VCSEL OPTICAL DETECTOR

[75] Inventors: Jong-kuk Mun, Kyungki-do; Yong-hee Lee, Daejeon; Eun-kyung Lee, Seoul; Kyung-ho Ha, Daejeon, all of Rep. of Korea

[73] Assignee: Samsung Electronics Co. Ltd., Kyungki-do, Rep. of Korea

[21] Appl. No.: 581,259

[22] Filed: Dec. 29, 1995

[51] Int. Cl.$^6$ .................... H01S 3/19; H01S 3/08; H01L 27/15

[52] U.S. Cl. .................... 372/50; 372/96; 257/80; 257/84; 250/214.1

[58] Field of Search ............ 372/96, 50; 385/12; 250/214.1; 257/80, 84, 85

[56] References Cited

U.S. PATENT DOCUMENTS

| | | | |
|---|---|---|---|
| 4,906,839 | 3/1990 | Lee | 250/239 |
| 5,285,466 | 2/1994 | Tabatabaie | 372/50 |
| 5,293,393 | 3/1994 | Kosaka | 372/45 |
| 5,361,273 | 11/1994 | Kosaka | 372/50 |
| 5,404,373 | 4/1995 | Cheng | 372/50 |
| 5,475,701 | 12/1995 | Hibbs-Brenner | 372/50 |
| 5,491,712 | 2/1996 | Lin et al. | 372/50 |

OTHER PUBLICATIONS

Hasnain et al., "Monolithic Integration of Photodetector with Vertical Cavity Surface Emitting Laser", Electronics Letters, vol. 27, No. 18, pp. 1630–1632 Aug. 1991.

*Primary Examiner*—Rodney B. Bovernick
*Assistant Examiner*—Luong-Quyen T. Phan
*Attorney, Agent, or Firm*—Sughrue, Mion, Zinn, Macpeak & Seas

[57] ABSTRACT

There is provided an assembly of a light source and an optical detector, each using a vertical cavity surface emitting laser (VCSEL). To control light emission of the VCSEL light source, spontaneous light emitted laterally therefrom is converted into an electrical signal. The optical detector for monitoring light is provided around the light source to supply the feedback electrical signal. The inner surface facing the light source of the optical detector is circular to absorb the spontaneous light and the outer surface thereof is polygonal having a plurality of peaks and valleys. Therefore, most of spontaneous light absorbed in the optical detector is reflected within, not penetrating the outer surface thereof, thereby extending the path of the spontaneous light in the optical detector and increasing the light intensity converted into an electrical signal.

2 Claims, 2 Drawing Sheets

ASSEMBLY OF VCSEL LIGHT SOURCE AND VCSEL OPTICAL DETECTOR

BACKGROUND OF THE INVENTION

The present invention relates to an assembly of a light source and an optical detector, each using a vertical cavity surface emitting laser (VCSEL) of a stack structure formed on a single substrate.

A VCSEL emits light vertically from a stack of semiconductor materials deposited on a substrate, unlike an edge emitting laser. Properties of the VCSEL include circular light output and single longitudinal mode operation. A light source, and an optical detector for detecting an error signal from an optical signal of light emitted from the light source can be integrated in this VCSEL. These advantages makes the VCSEL attractive for optical applications such as the light source for an optical pick-up.

However, since the lower surface of the VCSEL is combined with a semiconductor substrate while light is vertically emitted from the upper surface thereof, it is difficult to install an optical detector for monitoring.

To overcome this problem, a feed-back mechanism for the VCSEL is disclosed in U.S. Pat. No. 5,285,466.

In this mechanism, vertical light emission of a first VCSEL being a light source is controlled by using non-directional lateral spontaneous light thereof. The lateral spontaneous light is received in a second VCSEL provided around the first VCSEL. A signal detected from the received light is electrically fed back to the light source portion to control light emission of the light source. That is, the second VCSEL is used as an optical detector for receiving the lateral spontaneous light by applying no power or reverse biased voltage to the second VCSEL.

The structure and operation of a conventional assembly of a VCSEL light source and a VCSEL optical detector is shown in FIG. 1. The conventional assembly of a VCSEL light source and a VCSEL optical detector is comprised of a semiconductor substrate 10, a layered VCSEL light source 12 integrated on semiconductor substrate 10 for emitting light by application of a forward biased voltage, and an annular optical detector 14 surrounding light source 12 for absorbing lateral spontaneous light emitted therefrom. Optical detector 14 absorbs the spontaneous light emitted from light source 12, converts the light into an electrical signal, feeding it back to an electrode of light source 12, to control light emission. A reverse biased voltage is applied or no power is supplied to optical detector 14.

However, since annular optical detector 14 defines a very short light path, much of the light absorbed into the inner surface thereof penetrates through the outer surface thereof, and is not used to generate signal thereby lowering its light absorption level. As a result, it is very difficult to obtain light intensity large enough to detect a signal for controlling light emission of light source 12.

SUMMARY OF THE INVENTION

To circumvent the above problems, the object of the present invention is to provide an assembly of a VCSEL light source and a VCSEL optical detector, which extends the light path and, thus, increases the light absorption level by modifying the configuration of the optical detector.

To achieve the above object, there is provided an assembly of a VCSEL light source and a VCSEL optical detector comprising a semiconductor substrate, a light source comprising at least one P-layer and at least one N-layer stacked on the semiconductor substrate for emitting light in vertical and lateral directions, and an optical detector for monitoring light stacked around the light source for receiving the light laterally emitted from the light source. The structure of the optical detector comprises of at least one P-layer and at least one N-layer stacked. The inner surface thereof adjacent to the light source is cylindrical, and the outer surface thereof is approximately polygonal having a plurality peaks and valleys.

BRIEF DESCRIPTION OF THE DRAWINGS

The above object and advantages of the present invention will become more apparent by describing in detail a preferred embodiment thereof with reference to the attached drawings, in which.

Detailed Description of the Invention

An assembly of a VCSEL light source and a VCSEL optical detector for monitoring the same according to the present invention will be described in detail referring to the attached drawings.

Figure 1:
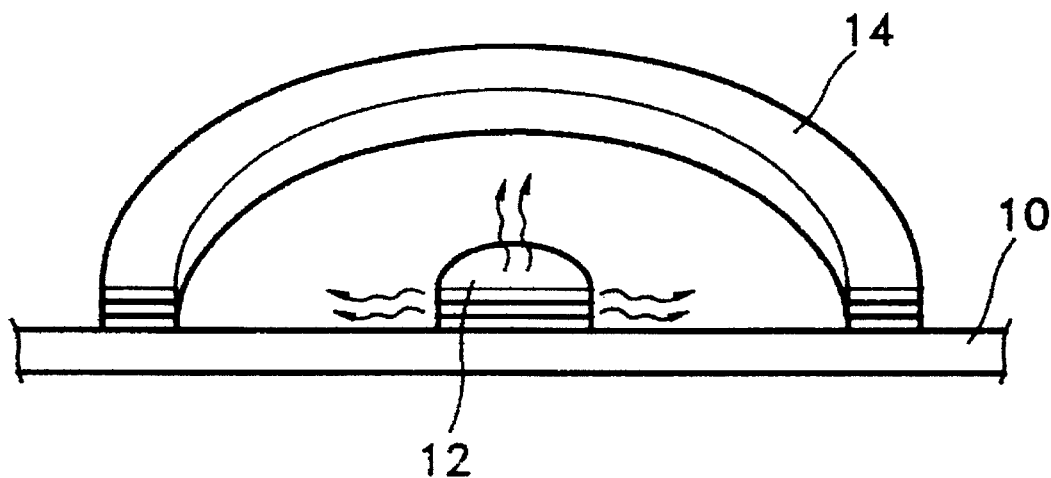
FIG. 1 is a perspective view of a conventional assembly of a light source and an optical detector, each using a VCSEL.
Figure 2:
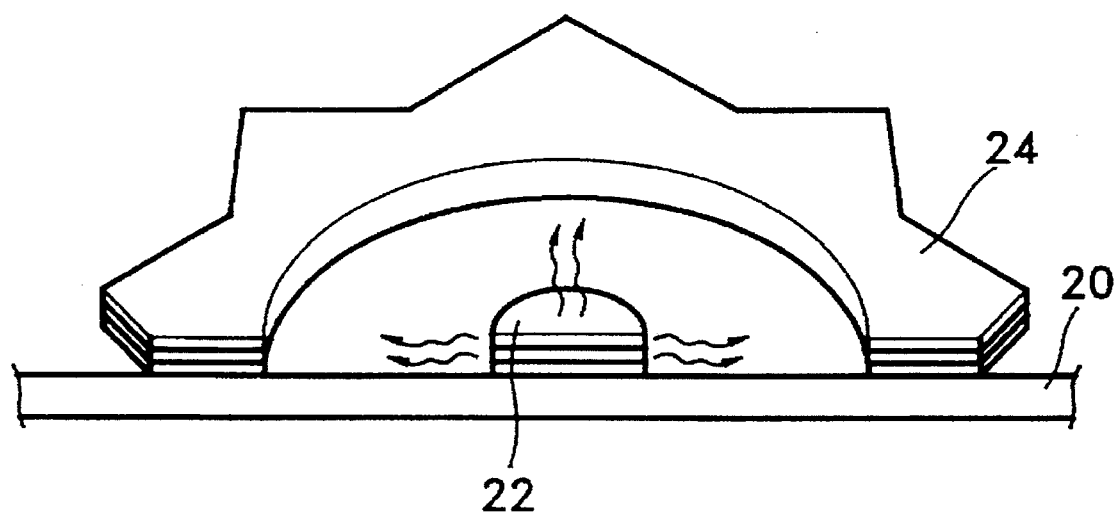
FIG. 2 is a perspective view of an assembly of a light source and an optical detector, each using a VCSEL, according to the present invention.

As shown in FIG. 2, a VCSEL as a light source 22 is formed into a first stack having at least one P-layer and at least one N-layer on, for example, an N-type GaAs semiconductor substrate 20. The first stack emits light through an active quantum well region formed between an N-type distributed Bragg reflector (DBR) layer and a P-type DBR layer, thus acting as light source 22. This VCSEL for light source 22 is forward biased by a biasing circuit including a power source and emits light vertically and non-directional spontaneous light laterally simultaneously as shown. The intensity of the spontaneous light is much smaller than that of the vertical light. To control the intensity of the vertical light by absorbing the spontaneous light, there is provided around light source 22 a second stack of an N-type DBR layer, a P-type DBR layer, and an active quantum well region between them, which are identical to those of the VCSEL for light source 22. The second stack acts as an optical detector 24 for monitoring light emitted from light source 22. A reverse biased voltage is applied or no power is supplied to optical detector 24 for monitoring. As described above, optical detector 24 for monitoring absorbs the spontaneous light laterally emitted from the first stack.

Optical detector 24 surrounding light source 22 is annular. The inner surface thereof facing the light source is cylindrical to absorb the non-directional spontaneous light. This absorbed spontaneous light is converted into an electrical signal, fed back to light source 22, and used to control the intensity of the vertically emitted light. Absorption occurs while the spontaneous light passes through the active region. As the light path in the active region gets longer, the intensity of light absorbed and converted into an electrical signal increases. To serve this purpose, the width of optical detector 24 can be made larger. However, this entails an increase in the size of the integrated circuit. To overcome this problem, the outer surface of optical detector 24 of the present invention is modified to be polygonal to have a plurality of peaks and valleys.

Figure 3:
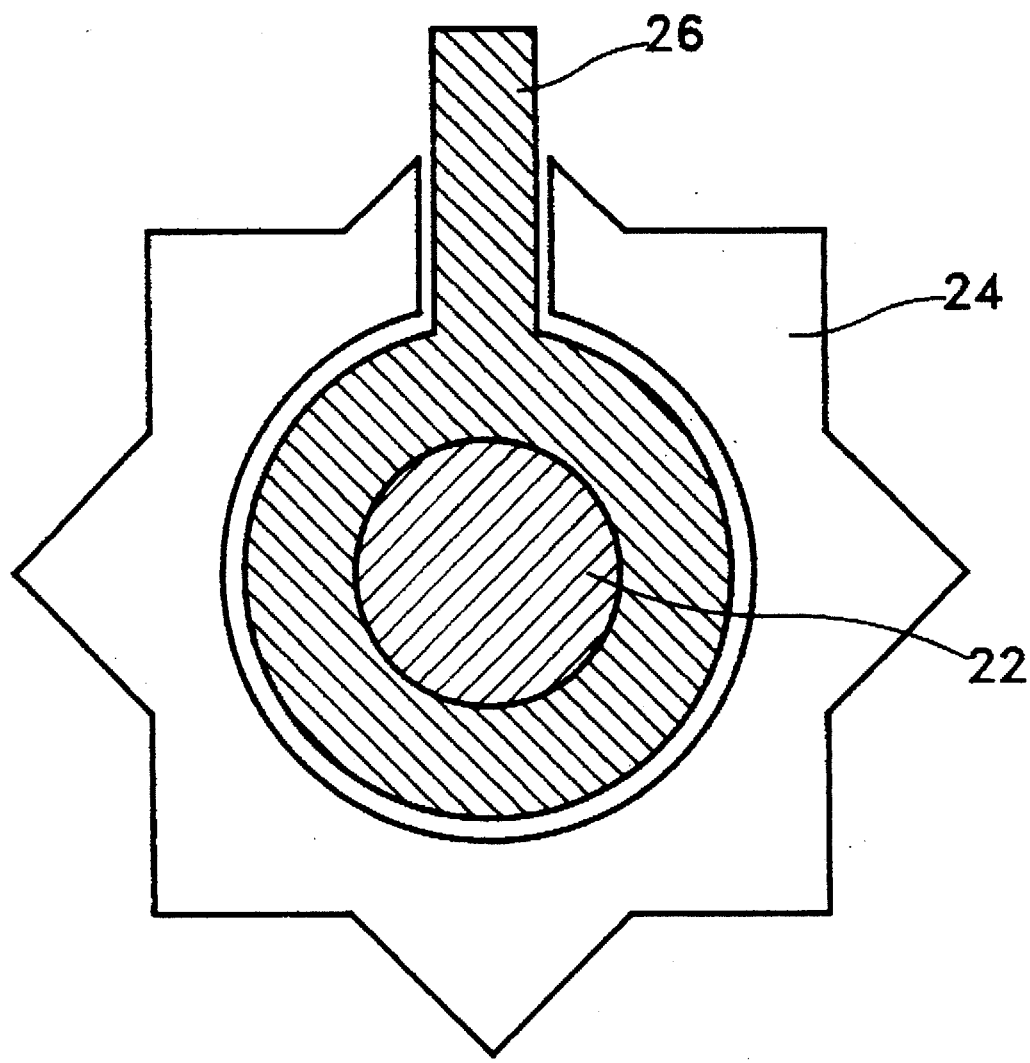
FIG. 3 is a plan view of the assembly of a light source and an optical detector, each using a VCSEL, according to the present invention.

FIG. 3 is a plan view of an assembly of a VCSEL light source and a VCSEL optical detector according to the present invention showing an exemplary configuration of optical detector 24. Reference numeral 26 denotes an electrode to which power is externally supplied to emit light from light source 22.

In the embodiment shown in FIGS. 2 and 3, the outer surface of optical detector 24 is approximately a polygon having 16 sides. In the optical detector 24 such-configured, most of the spontaneous light absorbed into the inner surface thereof is reflected within and doesn't penetrate the outer surface thereof. This reflection lengthens the spontaneous light path. Thus, the light intensity absorbed through the active region also increases thereby enabling efficient control of the intensity of the vertical light emitted from light source 22. Needless to say, the configuration of optical detector 24 may be modified in many ways, and its width may also be made larger, when necessary. As an example, if the length of the light path increases three fold by the reflection of light inside optical detector 24, about 80% of the spontaneous light can be absorbed, thus providing light intensity large enough to control light source 22.

As described above, according to the assembly of a VCSEL light source and a VCSEL optical detector of the present invention, the level of light absorption is increased by extending the light path through reflections off the polygonal surfaces. As a result, despite a partial loss of the spontaneous light between the light source and the optical detector, a sufficient electrical signal is realized to control the intensity of the vertical light emitted from the light source.

What is claimed is:

1. An assembly of a VCSEL light source and a VCSEL optical detector, comprising a semiconductor substrate, a light source comprising at least one P-layer and at least one N-layer stacked on said semiconductor substrate for emitting light in vertical and lateral directions and an optical detector for monitoring light stacked around said light source for receiving the light laterally emitted from said light source, wherein the structure of said optical detector comprises at least one P-layer and at least one N-layer stacked, the inner surface thereof adjacent to said light source is cylindrical, and the outer surface thereof is approximately polygonal having a plurality of peaks and valleys, whereby said peaks and valleys increase the VCSEL optical detector's light absorption level.

2. An assembly of a VCSEL light source and a VCSEL optical detector as claimed in claim 1, wherein the outer surface of said optical detector is substantially a regular polygon.

* * * * *